US010013025B2

(12) United States Patent
Cowley et al.

(10) Patent No.: US 10,013,025 B2
(45) Date of Patent: Jul. 3, 2018

(54) WEARABLE DEVICE WITH POWER STATE CONTROL

(71) Applicant: INTEL CORPORATION, Santa Clara, CA (US)

(72) Inventors: Nicholas P. Cowley, Wrougton (GB); Ruchir Saraswat, Swindon (GB); Richard Goldman, Cirencester (GB); Ryan Palmer, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 485 days.

(21) Appl. No.: 14/567,581

(22) Filed: Dec. 11, 2014

(65) Prior Publication Data

US 2016/0170446 A1    Jun. 16, 2016

(51) Int. Cl.
*G06F 1/16*    (2006.01)
*G06F 3/041*   (2006.01)
(Continued)

(52) U.S. Cl.
CPC ............ *G06F 1/163* (2013.01); *G06F 1/1635* (2013.01); *G06F 1/26* (2013.01); *G06F 1/3206* (2013.01);
(Continued)

(58) Field of Classification Search
CPC .................................................... G06F 3/0414
(Continued)

(56) References Cited

U.S. PATENT DOCUMENTS

2004/0119599 A1*  6/2004  Stevenson ............... B60R 22/48
                                               340/686.1
2006/0181083 A1*  8/2006  Steigerwald ............. H02J 7/32
                                                   290/1 A
(Continued)

FOREIGN PATENT DOCUMENTS

| EP | 2698686 A2 | 2/2014 |
| KR | 10-1404234 B1 | 6/2014 |
| WO | 2014140827 A2 | 9/2014 |

OTHER PUBLICATIONS

International Search Report and Written Opinion of the International Searching Authority dated Dec. 24, 2015 for PCT Application No. PCT/US2015/050790, 17 pages.
(Continued)

*Primary Examiner* — Adi Amrany
(74) *Attorney, Agent, or Firm* — Schwabe, Williamson & Wyatt, P.C.

(57) ABSTRACT

Embodiments of the present disclosure provide techniques and configurations for a wearable device with power state control. In one instance, the device a functional module to operate in a first power state or in a second power state that is different from the first power state; a power source coupled with the functional module to provide operational power to the functional module; and a power state control module coupled with the functional module, to cause the functional module to transition from the first power state to the second power state in response to an input. The power state control module may comprise a power generating device to generate power responsive to the input, independent of the power source, and in response to the generated power, cause the functional module to transition from the first power state to the second power state. Other embodiments may be described and/or claimed.

13 Claims, 7 Drawing Sheets

(51) Int. Cl.
*G06F 1/26* (2006.01)
*G06F 1/32* (2006.01)
*H01L 41/113* (2006.01)
*H02N 2/18* (2006.01)

(52) U.S. Cl.
CPC .......... *G06F 1/3215* (2013.01); *G06F 3/0414* (2013.01); *H01L 41/113* (2013.01); *H02N 2/181* (2013.01)

(58) Field of Classification Search
USPC .................................................. 307/126, 130
See application file for complete search history.

(56) References Cited

U.S. PATENT DOCUMENTS

| | | | | |
|---|---|---|---|---|
| 2007/0257634 | A1* | 11/2007 | Leschin | H01L 41/113 320/107 |
| 2008/0011794 | A1* | 1/2008 | Daniel | A45F 5/02 224/183 |
| 2008/0168840 | A1* | 7/2008 | Seeley | G01H 11/08 73/649 |
| 2009/0061958 | A1* | 3/2009 | Osgood | A45F 5/00 455/575.3 |
| 2010/0141417 | A1* | 6/2010 | Boes | B60C 23/0408 340/447 |
| 2011/0014956 | A1 | 1/2011 | Lee et al. | |
| 2011/0115335 | A1* | 5/2011 | Pelletier | G06F 1/3203 310/318 |
| 2012/0074184 | A1* | 3/2012 | Morgan | A45F 5/00 224/222 |
| 2012/0152990 | A1* | 6/2012 | Kulas | A45F 5/00 224/222 |
| 2013/0313910 | A1* | 11/2013 | Sasaki | H02J 7/025 307/104 |
| 2014/0054335 | A1* | 2/2014 | Morgan | A45C 11/00 224/222 |
| 2014/0143678 | A1 | 5/2014 | Mistry et al. | |
| 2015/0123931 | A1* | 5/2015 | Kitchens | G06F 3/0414 345/174 |
| 2015/0186609 | A1* | 7/2015 | Utter, II | A61B 5/0022 600/301 |
| 2015/0277575 | A1* | 10/2015 | Ataee | G06F 3/015 345/156 |
| 2015/0339726 | A1* | 11/2015 | Herring | G06Q 30/0269 705/14.58 |
| 2016/0007931 | A1* | 1/2016 | Rubin | A61B 5/02438 600/484 |
| 2016/0066818 | A1* | 3/2016 | Cowley | A61B 5/6807 600/592 |
| 2016/0275771 | A1* | 9/2016 | Visweswara | A61B 5/6822 |
| 2017/0170383 | A1* | 6/2017 | Sammoura | H01L 41/331 |

OTHER PUBLICATIONS

Sony Lifelong, "Log your day. Every day." http://www.sonymobile.com/global-en/apps-services/lifelog/.
Adidas, "Speed Cell." http://micoach.adidas.com/us/speed_cell.
Fitbit, "Fitbit Flex." http://www.fitbit.com/flex/specs.

* cited by examiner

WEARABLE DEVICE WITH POWER STATE CONTROL

FIELD

Embodiments of the present disclosure generally relate to the field of sensor devices, and more particularly, to wearable devices with power state control to transition the wearable device from one power state to another power state.

BACKGROUND

Modern wearable devices are expected to work on demand, e.g., may be expected to "wake up" (e.g., transition from a standby mode to operational mode) and become operational substantially instantly and with minimal user input. These devices may not typically use mechanical switches to turn the power source (battery) on and off because the switches may not be user friendly or may not be supported by modern industrial design expectations. Manufacturers have typically relied on a sensor to provide a "wake up" command. A common solution may be to employ the inertial sensors (accelerometers) to "wake up" associated wearable devices on movement detected by the sensors. However, the inertial sensors may be set to trigger on at a particular gravitation force threshold or acceleration. In addition or in the alternative, these sensors may be polled by a host microcontroller of a wearable device at a determined frequency rate (e.g., 1 Hz or higher) in order to receive movement detection results. Accordingly, these activities aimed at "waking up" a wearable device may consume substantial power in a standby mode, which may have a significant impact on the standby lifetime of the wearable device and the associated power source.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide techniques and configurations for a wearable device with power state control. In one instance, the device may include a functional module to operate in a first power state or in a second power state that is different from the first power state. The device may further include a power source coupled with the functional module to provide operational power to the functional module. The device may further include a power state control module coupled with the functional module, to cause the functional module to transition from the first power state to the second power state in response to an input. The power state control module may comprise a power generating device to generate power responsive to the input, independent of the power source, and in response to the generated power, cause the functional module to transition from the first power state to the second power state.

In the following detailed description, reference is made to the accompanying drawings that form a part thereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other.

Figure 1:
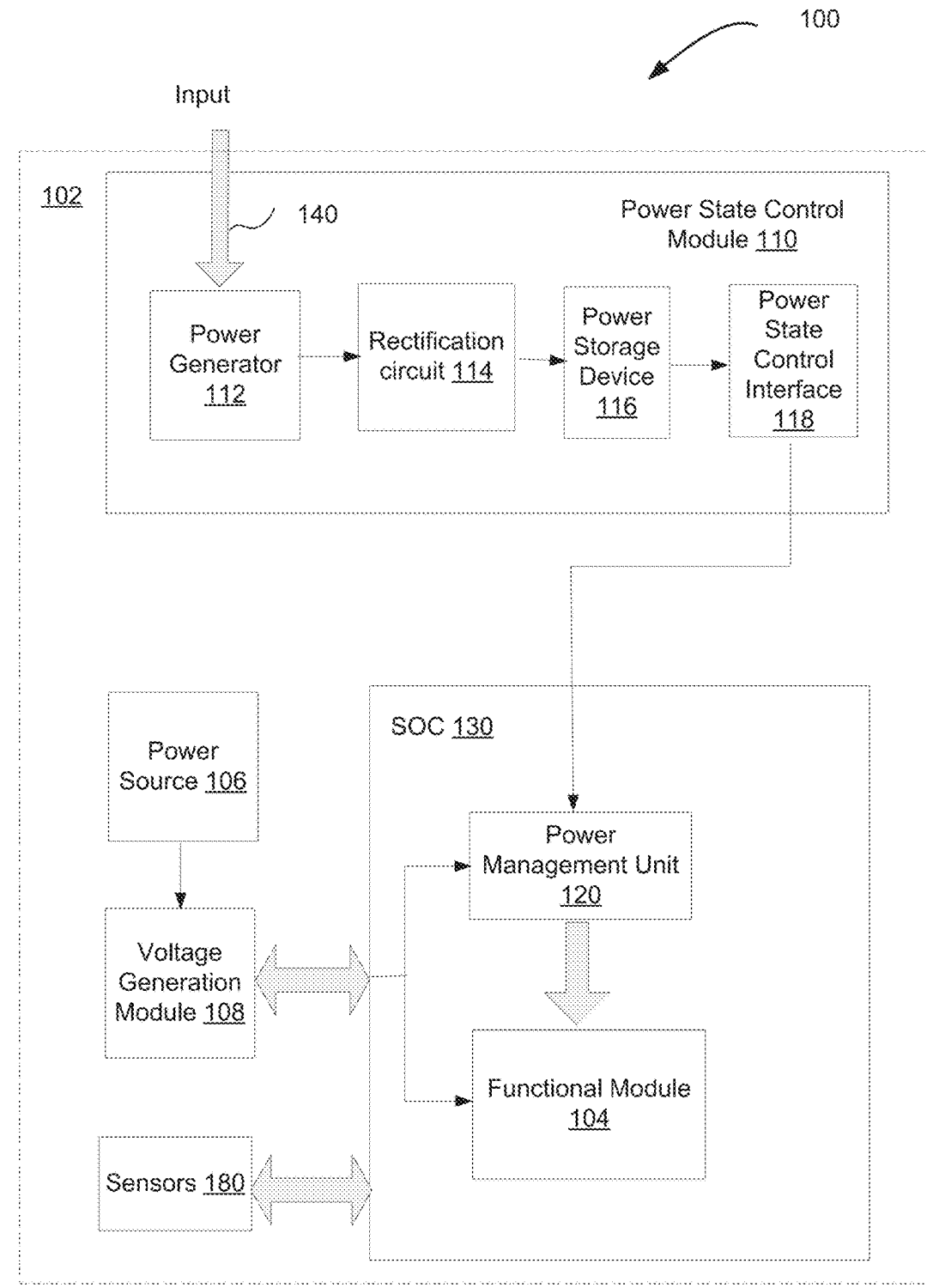
FIG. 1 is a block diagram of an example apparatus, such as a wearable device with power state control, in accordance with some embodiments of the present disclosure.

FIG. 1 is a block diagram of an example apparatus 100 in accordance with some embodiments of the present disclosure. In some embodiments, the apparatus 100 may comprise a wearable device configured with power state control in accordance with embodiments described herein.

The apparatus 100, such as a wearable device, may be configured to provide a variety of different functions. For example, a wearable device may provide sensor measurement of data related to a user's activities, such as walking, running, jumping, or the like. A wearable device may include, but may not be limited to, wearable cameras, smart watches, intelligent bracelets, smart glasses, heart rate monitors, tracking devices, and the like.

In some embodiments, the apparatus 100 may comprise a housing 102 made of a suitable rigid or semi-rigid material, such as thermoplastics, polyethylene foam, cork, acrylic, polypropylene, composite carbon fiber, or other material commonly used for such purposes. The housing 102 of the apparatus 100 may include (e.g., encapsulate) some or all of the apparatus 100 components described herein.

The apparatus 100 may include a functional module 104 configured to enable and manage one of more functionalities of the apparatus 100. For example, the functional module 104 may be communicatively coupled with a sensor unit 180 and configured to control, e.g., manage and process the readings provided by the sensor unit 180. The sensor unit 180 may include one or more sensors (e.g., a sensor array) that may be configured to measure data indicative of various processes (e.g., associated with a user). In some embodiments, at least the functional module 104 of the apparatus 100 may be integrated in a system on chip (SOC) 130. The functions provided by function module 104 may, e.g., but are not limited to processing data provided by the sensor unit 180 and providing processed data to user (e.g., on a display (not shown), and/or providing the data to an external computing device (not shown) for further processing.

The functional module 104 may be configured to operate at least in two power states: a first power state or a second power state that is different from the first power state. In embodiments, the functional module may comprise two or more components, such as a processor, a memory (e.g., programmable registers), communication components, and the like (not shown).

The first power state of the apparatus 100 may correspond to a standby mode, in which a first number (but not all) of the components of the functional module 104 may be powered on. The second power state of the apparatus 100 may correspond to an operational mode, in which a second number of the components of the functional module 104 (collectively consuming more power than the first number of components) are powered on. In embodiments, the second number may be different, e.g., greater than the first number. For example, some (but not all) components of the functional module 104 may consume power in the standby mode. For example, programmable registers (not shown) of the functional module 104 may be required to retain stored information when the apparatus 100 is not fully operational (e.g., in standby mode). In operational mode, at least a processor, a memory, and communicative components of the functional module 104 may be powered on.

The apparatus 100 may include a power source 106 (e.g., a battery) coupled with the functional module 104, to provide power to the functional module 104 in accordance with the first or second power state. In some embodiments, the power source 106 may be coupled with the functional module 104 via a voltage generation module 108. The voltage generation module 108 may be configured to convert the voltage provided by the power source 106 into voltage suitable for use by the SOC 130 in a first or second power state. For example, the power source 106 may be configured to provide voltage of 4.2 V, whereas the SOC 130 may require 1.8 V or 3.3 V to operate in first or second power state respectively.

The apparatus 100 may further include a power state control module 110 coupled with the functional module 104, to cause the functional module to transition from the first power state to the second power state in response to an input 140 (e.g., user input). The power state control module 110 may comprise a power generating device 112 to generate power in response to an input, and to transform the generated power into a command to the functional module 104 to transition from the first power state to the second power state.

In some embodiments, the power generating device 112 may comprise a piezoelectric device to generate electric charge in response to the input (e.g., user input, such as a tap). Accordingly, the input may comprise an application of mechanical force (e.g., pressure or flexing) to the power generating device 112. The amount of electric charge produced by the power generating device 112 (e.g., piezoelectric device) may be directly proportional to the pressure or flexing applied to a material comprising the piezoelectric device. Using a piezoelectric device as the power generating device 112 may enable production and harvesting of electrical power that may be needed to produce a command to the functional module to transition from a first power state to a second power state, for example.

The power state control module 110 may further comprise a rectification circuit 114 coupled with the power generating device 112, to rectify and limit voltage corresponding to the electric charge generated by the power generating device 112.

The power state control module 110 may further comprise a charge storage device 116 (e.g., a capacitor) coupled with the rectification circuit 114, to store the electric charge at the voltage limited by the rectification circuit 114.

The power state control module 110 may further comprise a power state control interface 118 coupled with the charge storage device 116, to generate the command to a power management unit 120 associated with the functional module 104, to cause the functional module 104 to transition from the first power state to the second power state, based on the electrical charge stored by the charge storage device 116. The command may include, for example, a sequence of operations to be performed by the power management unit 120. The power management unit 120 may, in accordance to the sequence of operations, cause the SOC 130 to transition from the first power state to the second power state, including, e.g., providing a command to the voltage generation module 108 to change the voltage requisite for the first power state of the SOC 130 to the voltage requisite for the second power state of the SOC 130.

While FIG. 1 illustrates the power management unit 120 and functional module 104 as integrated on the SOC 130, the FIG is not meant to be limiting, other apparatus 100 components may also be integrated on the SOC 130, although not shown in FIG. 1. For example, power state control interface 118 (or portion thereto) may be integrated on the SOC 130. In some embodiments, rectification circuit 114 and power storage device 116 may also be disposed in SOC 130, if supported by the SOC process. Similarly, in some embodiments the voltage generation module 108 may be integrated on the SOC 130.

In conventional wearable devices, a power source may continuously, even in the standby mode, provide power to a power state control module (or a device component with a similar function) of a wearable device to facilitate a transition from a standby mode to operational mode, when demanded.

In contrast, in the embodiments described herein, the power state control module 110 having the power generating device 112 may be capable of generating power of a desired level to enable transition from the standby mode to operational mode. Accordingly, the embodiments of the apparatus 100 described herein may provide for saving power of the power source (battery) and prolonging its life.

Furthermore, the use of the power generating device 112 configured to produce power in response to an input may eliminate a need for at least some components utilized in conventional wearable device solutions. For example, an accelerometer utilized in conventional wearable devices to detect device's motion and trigger a transition from standby mode to operational mode, may not be required to generate output in response to a movement to trigger the transition from standby to operation mode in the embodiments described herein. Also, power that may be provided by a power source in conventional solutions to periodically poll an accelerometer may not be needed in the described embodiments, which may result in additional power savings.

Figure 2:
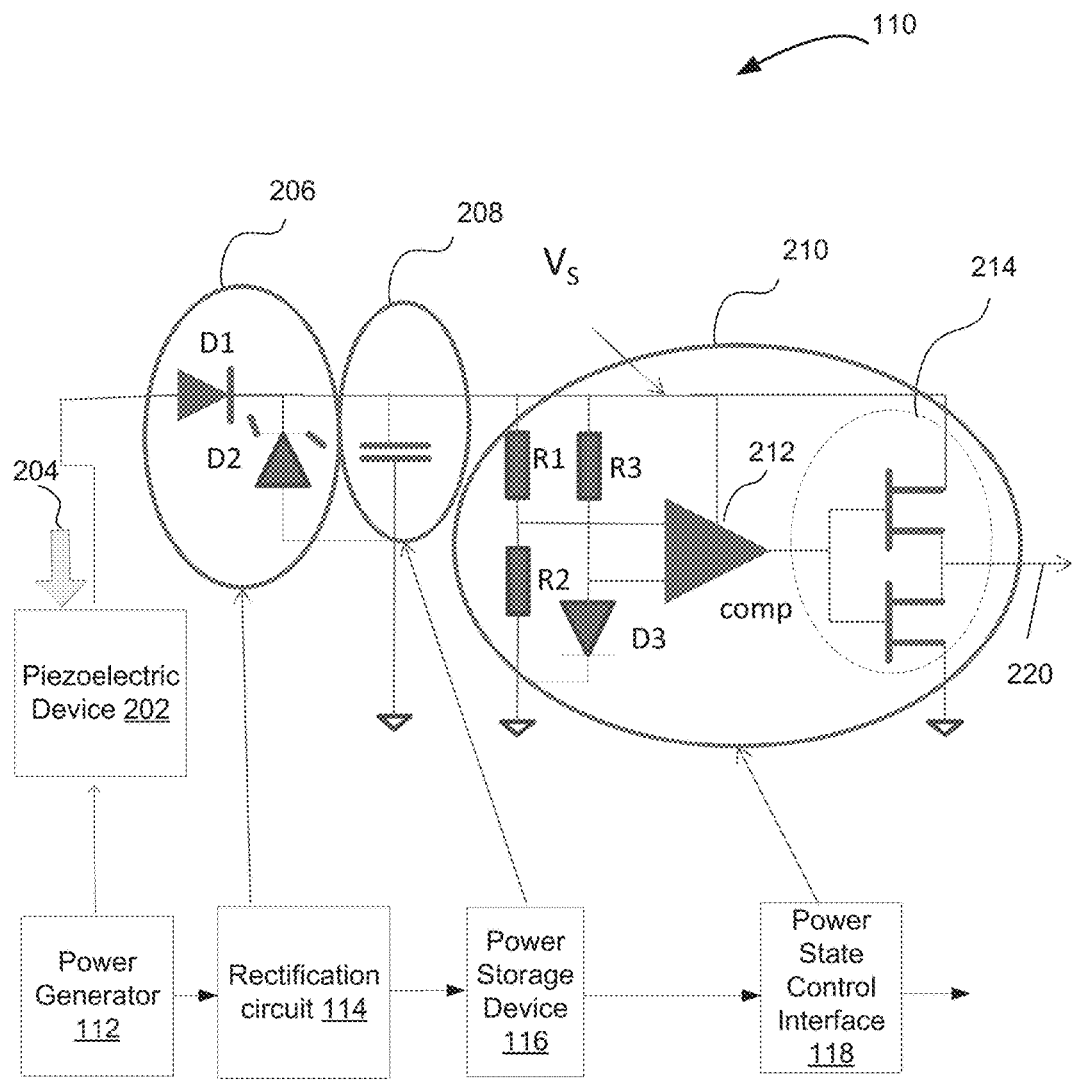
FIG. 2 is a schematic diagram illustrating an example implementation of a power state control module of an apparatus described in reference to FIG. 1, in accordance with some embodiments.

FIG. 2 is a schematic diagram illustrating an example implementation of a power state control module of an apparatus described in reference to FIG. 1, in accordance with some embodiments. As discussed in reference to FIG. 1, the power state control module 110 of the apparatus 100 may include the power generator 112, rectification circuit 114, power storage device 116, and power state control interface 118.

As described above, the power generating device 112 may comprise a piezoelectric device 202 configured to generate electric charge (voltage) in response to input 204. The input 204 may be, for example, a tap on the piezoelectric device 202. The voltage signal generated by the power generator 112 (e.g., piezoelectric device 202) may be passed to the rectification circuit 114. As shown, the rectification circuit 114 may be implemented as a rectification and voltage limiting circuit 206. In the illustrated example, the rectification and voltage limiting circuit 206 may comprise a diode D1 in series with a Zener diode D2. As the voltage supplied by the piezoelectric device 202 may rise, the diode D1 may forward conduct and may be limited on the Zener diode D2 by its breakdown voltage.

The power storage device 116 may comprise a capacitor 208 coupled with the rectification and voltage limiting circuit 206. The capacitor 208 may be placed across the Zener diode D2 and may store electric charge supplied by the piezoelectric device 202 at the voltage defined by the Zener diode D2 breakdown voltage. The diode D1 may prevent discharge of the capacitor 208 for negative transients from the piezoelectric device 202 with respect to the Zener diode D2 breakdown voltage. For example, if the Zener diode D2 has breakdown voltage of 3 V, the diode D1 may conduct when the voltage exceeds 3V (plus D1 forward conduction voltage). The diode D1 may not conduct below this threshold, causing the capacitor 208 to store electric charge at about 3V level.

The electric charge stored on the capacitor 208 may be used as the power source for the power state control interface 118. In the illustrated example, the power state control interface 118 may comprise a wake up interface circuitry 210. The circuitry 210 may include a comparator 212 that may be powered from the power source provided by the capacitor 208. An arrangement of resistance R1 in series with resistance R2 and R3 and in series with diode D1 may ensure that the command to transition from the first power state to the second power state (e.g., a wake up command) may not be triggered until a suitable voltage level has been established on the power storage device 116. More specifically, the voltage across resistance R2 may be $V_s*R2/(R1+R2)$, where Vs is voltage across the Zener diode D2 and capacitor 208. The voltage across the forward-biased diode D3 may be the forward conduction voltage Vf. Therefore, the comparator 212 may not trigger until $V_s*R2/(R1+R2)=V_f$. When the comparator 212 triggers, it may drive a push-pull output stage 214 to generate a command signal 220 to interface with the SOC 130, as described in reference to FIG. 1.

In some embodiments, an additional circuit may be deployed (not shown) to sense the rate of input, e.g., taps, in order to reduce or eliminate a chance of accidental waking of the functional module 104. This circuit may be implemented as a count block powered by the power storage device, the output of which may be used to gate the command (e.g., voltage signal Vs).

It will be appreciated that the example implementation of the power state control module is provided for illustration only and is not limiting to this disclosure. Different circuits to implement the components of the power state control module 112 may be deployed. For example, the Zener diode D2 may be omitted and the peak voltages may be stored on the capacitor 208. A voltage regulator may then be connected to the capacitor 208 to generate a fixed output voltage to power the wake up interface circuitry 210.

Figure 3:
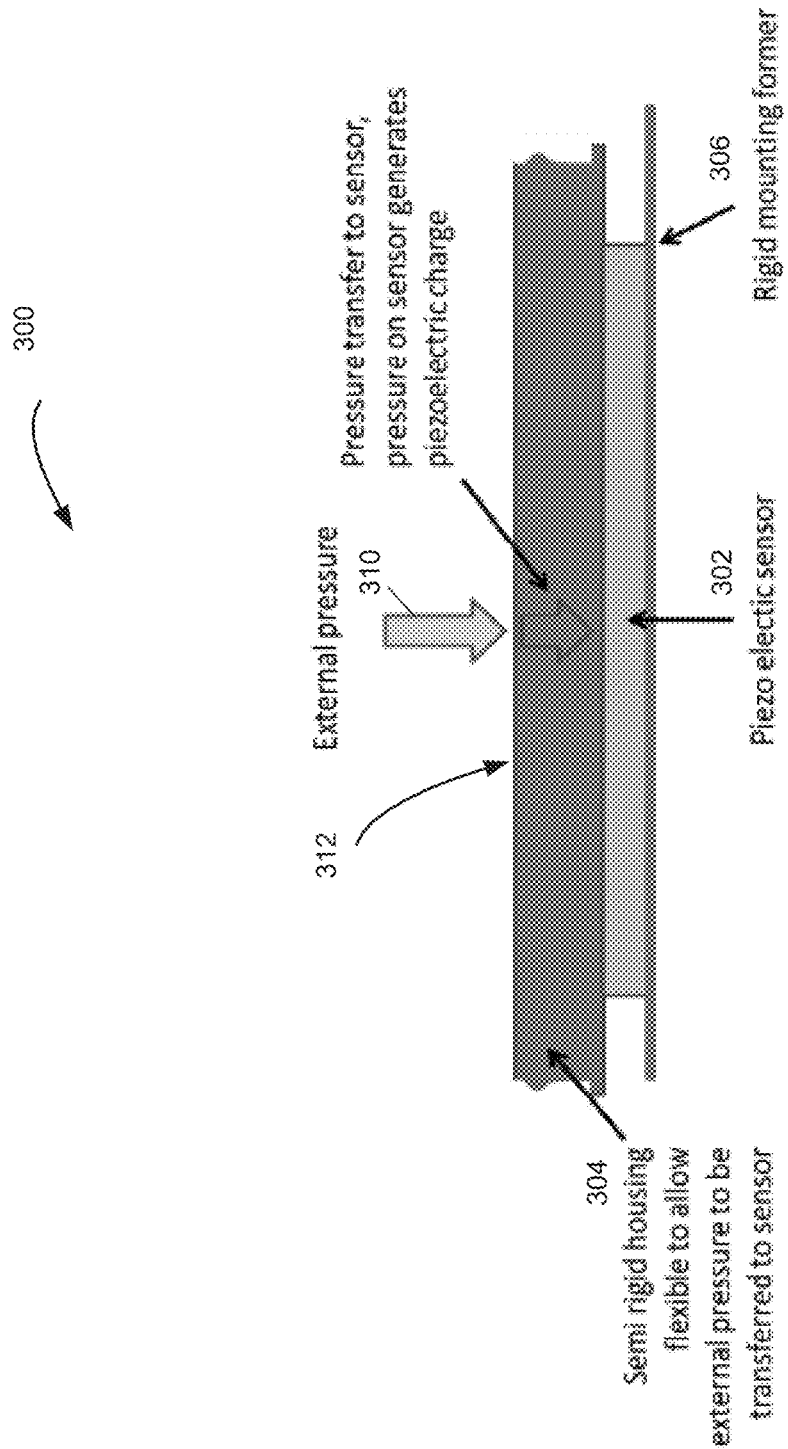
FIGS. 3-5 illustrate schematic representations of example piezoelectric arrangements disposed about a housing of a wearable device, according to some embodiments.
Figure 4:
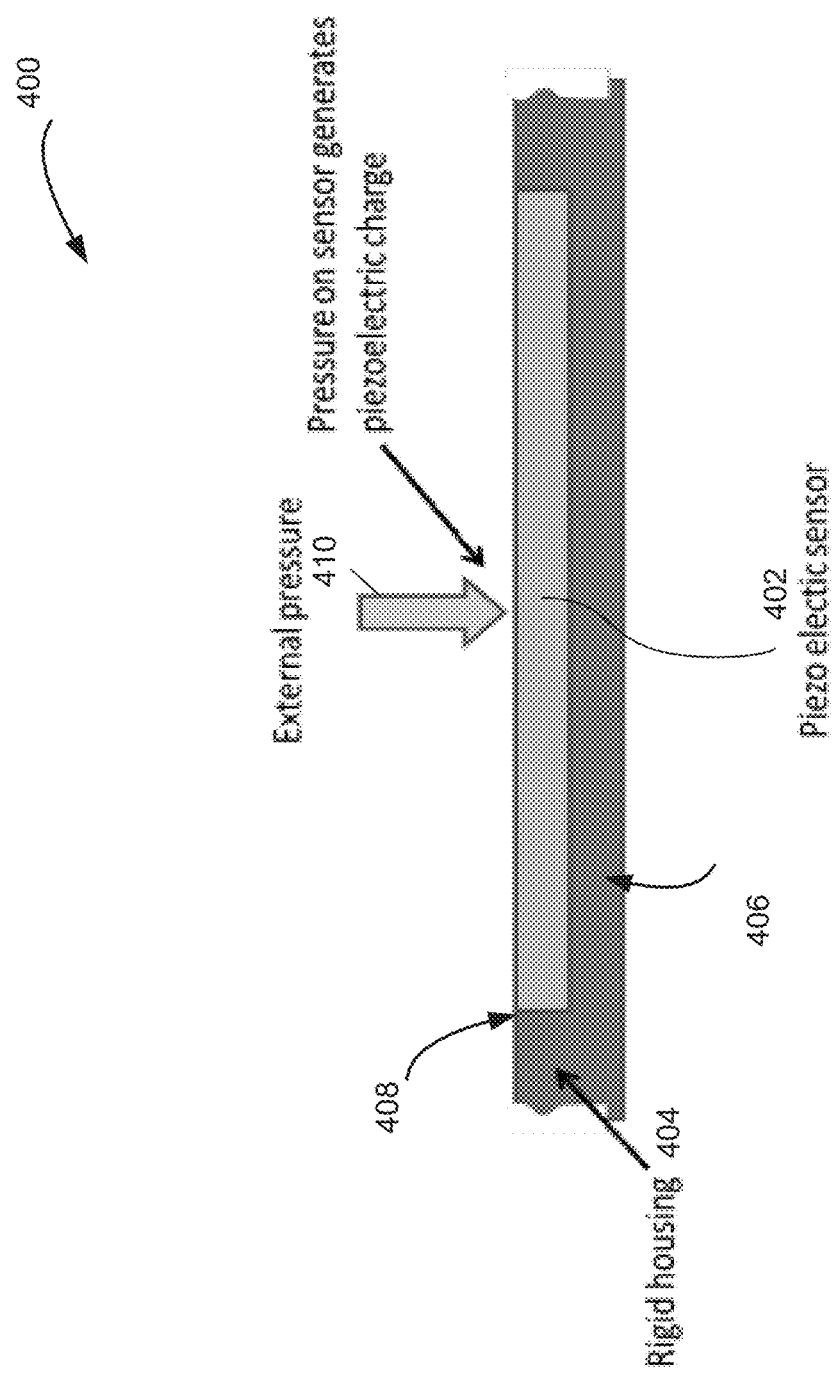
Figure 5:
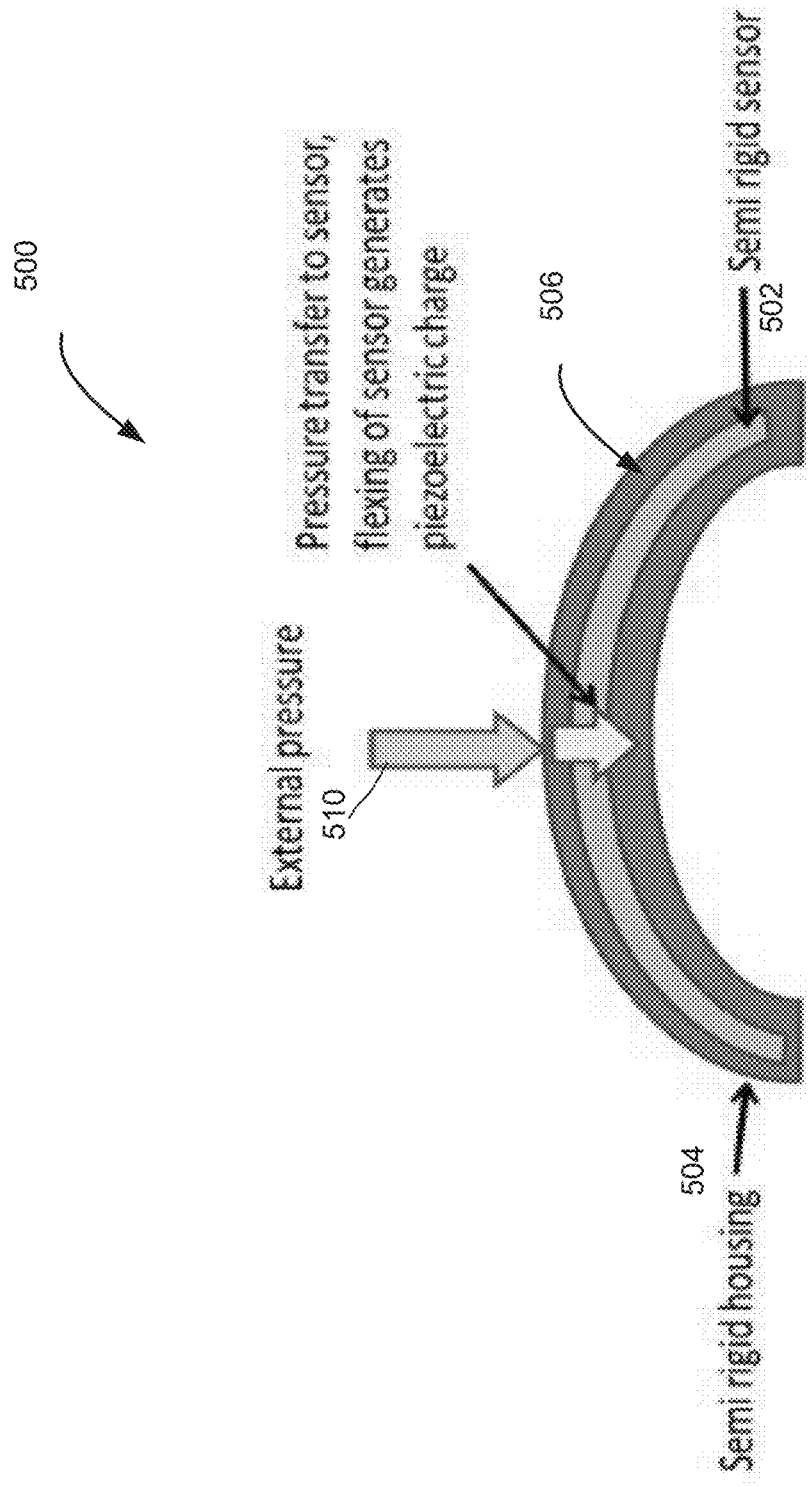

FIGS. 3-5 illustrate schematic representations of example piezoelectric arrangements disposed about a housing of a wearable device, according to some embodiments.

FIG. 3 is a schematic diagram illustrating a cross-section of an example embodiment of a piezoelectric arrangement 300, according to some embodiments. As shown, a piezoelectric device 302 (sensor) may be disposed internal to a wearable device (not shown), e.g., inside a housing 304 of the wearable device on a rigid mounting former 306. As shown, the piezoelectric device 302 may be placed directly underneath the semi-rigid material comprising the housing 304. The piezoelectric device 302 may comprise monolithic piezoelectric material, for example.

The input to the piezoelectric device 302 may comprise an external pressure 310 (e.g., in a form of a tap) to be applied to a portion 312 of the housing 304 above the piezoelectric device, to be transferred to the piezoelectric device 302 via the semi-rigid material of the housing 304, to cause generation of the electric charge.

FIG. 4 is a schematic diagram illustrating a cross-section of an example embodiment of a piezoelectric arrangement 400, according to some embodiments. More specifically, FIG. 4 illustrates an example where a piezoelectric device 402 (sensor) may be mounted external to a housing 404 of a wearable device (not shown). The piezoelectric device 402 may comprise monolithic piezoelectric material, for example.

The housing 404, or a portion 406 of the housing 404 on which the piezoelectric device 402 may be placed, may comprise a rigid material. As shown, the piezoelectric device 404 may be disposed on the rigid material externally to the housing 404.

The input 410 may comprise an external pressure (e.g., a tap) to be applied to the piezoelectric device 402, to cause generation of the electric charge. FIG. 4 illustrates an example embodiment in which the piezoelectric device 402 is substantially embedded within the housing 404. In some embodiments, the piezoelectric device 402 may be partially embedded in the housing 404 or attached to a surface 408 of the housing 404. The piezoelectric device 402 may be covered with a protective layer (not shown).

FIG. 5 is a schematic diagram illustrating a cross-section of an example embodiment of a piezoelectric arrangement 500, according to some embodiments. More specifically, FIG. 5 illustrates an example where a piezoelectric device 502 (sensor) may be formed inside at least a portion 506 of a body of the housing 504 of a wearable device (not shown). The housing 504 may comprise a semi-rigid material susceptible to pressure. The input 510 may comprise an external pressure to be applied to the semi-rigid material of the body of the housing, to cause flexing of the piezoelectric device, which may result in generation of the electric charge.

The piezoelectric device 502 may comprise a flexible piezoelectric sensor, produced from a macro fiber composite material (MFC) or advanced polymer structures. MFC devices may have a desired thickness (e.g., may be ultra-thin) and may be suitable to encapsulation in materials commonly used to manufacture wearable devices. For example, the MFC device may be built from fibers or strands of material having piezoelectric properties. The material may be embedded in an epoxy matrix and coated, e.g., with Kapton® skin. Due to the manufacturing process, the MFC device may be flexible and may be bonded to or embedded in other materials, which may form a part or the whole of a curved surface, such as the portion of the body 506 of the housing 504 illustrated in FIG. 5.

The embodiment described in reference to FIG. 5 illustrates a structure of the body of the housing 504 that comprises a bubble-shaped portion 506. However, the embodiments described herein may not be limited to the illustrated structure of the housing 504. In some embodiments, the structure of the housing 504 may be linear or may have a curvature of a different shape.

Furthermore, the example assemblies illustrated in FIGS. 3-5 are presented for illustration purposes and are not limiting to this disclosure. Different ways of placement of a piezoelectric device in a wearable device may be contemplated. For example, the piezoelectric device may be embedded in a mounting feature or a restraining feature of the wearable device (e.g., a strap, clip, or the like) and made accessible to the input, e.g., a tap as described above.

In addition or in the alternative to embodiments described in reference to FIGS. 2-5, the example implementations of a power generating device (e.g., 112 of FIG. 1) may include devices capable to produce electric charge in response to different types of input.

In some embodiments, a power generating device may comprise a device made of a material (e.g., fur or plastic) to generate electric charge in response to input, e.g., a stroke.

In some embodiments, a power generating device may comprise a device to generate electric charge in response to heat. Input to such device may comprise a hold (e.g., over a determined period of time) to provide the heat to the device. Such a device may be formed, for example, by combining two electrically dissimilar materials, which may be asymmetrically heated. Electrical power may be generated by either the Seebeck or Peltier effect. Such a power generating device may be embedded on the outside of a wearable device or form a part of the wearable device enclosure (housing).

In some embodiments, a power generating device may comprise a device to generate electric charge in response a flash with light. Such a device may be formed by a photoelectric cell where electricity may be generated by photo excitation of electrons in appropriate materials. Such a power generating device may be embedded on the outside of a wearable device or form a part of the wearable device enclosure (housing).

In some embodiments, a power generating device may comprise a device that includes a component made of a ferromagnetic material, movable through a coil, to generate electric charge in response to a shake or other type of input inducing the ferromagnetic component to move thought the coil.

In some embodiments, a power generating device may comprise a bio-battery to generate electric charge in response a disposition of an electrolyte across the bio-battery, wherein input may comprise a touch to deliver the electrolyte (e.g., moisture of skin) to the bio-battery.

Figure 6:
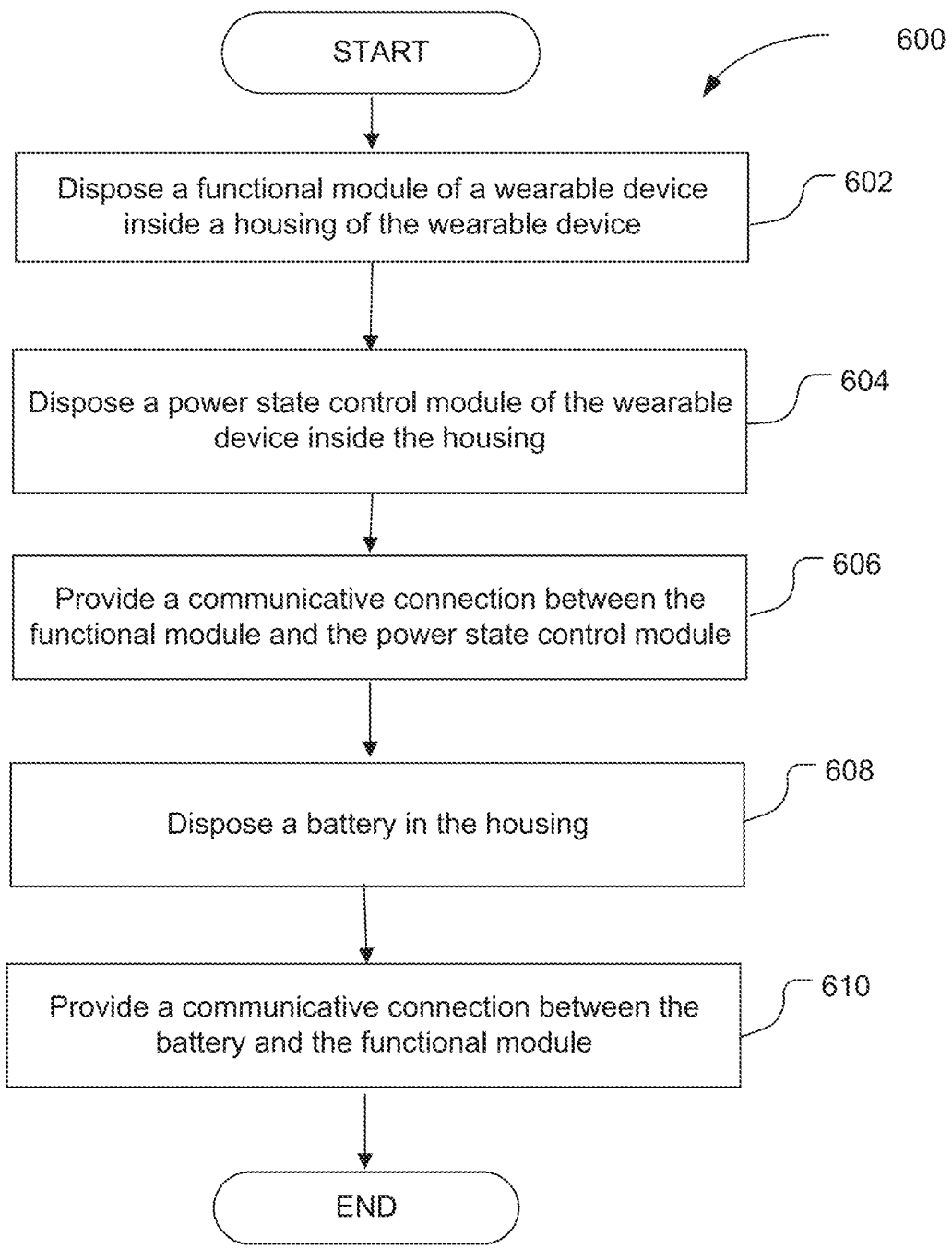
FIG. 6 is a process flow diagram for fabricating a wearable device with power state control, in accordance with some embodiments.

FIG. 6 is a process flow diagram 600 for fabricating a wearable device with power state control, in accordance with some embodiments. The device may include the components of apparatus 100 described in reference to FIGS. 1-5 respectively, and will be referenced accordingly.

The process 600 may begin at block 602 and include disposing a functional module (e.g., 104) of a wearable device (e.g., 100) inside a housing (e.g., 102) of the wearable device. As described, the functional module may be operable in a first power state or in a second power state. As described, the functional module (and other components of the wearable device 100) may be provided in a form of a SOC.

At block 604, the process 600 may include disposing a power state control module (e.g., 110) of the wearable device inside the housing. The disposing may include placing a piezoelectric device (e.g., 302, 402, or 502) of the power state control module directly underneath a surface of the housing or on the surface of the housing, to be accessible to an input (e.g., 310, 410, or 510).

At block 606, the process 600 may include providing a communicative connection between the functional module and the power state control module (as described in reference to FIG. 1), to enable transitioning of the functional module from the first power state to the second power state in response to the input to the piezoelectric device. As described, the input (e.g., a tap) may cause the piezoelectric device to provide an electric signal causing the transitioning of the functional module from the first power state to the second power state.

At block 608, the process 600 may include disposing a power source (e.g., 106), such as a battery in the housing.

At block 610, the process 600 may include providing a communicative connection between the battery and the functional module (as described in reference to FIG. 1), to provide power to the functional module in accordance with the first or second power state.

Figure 7:
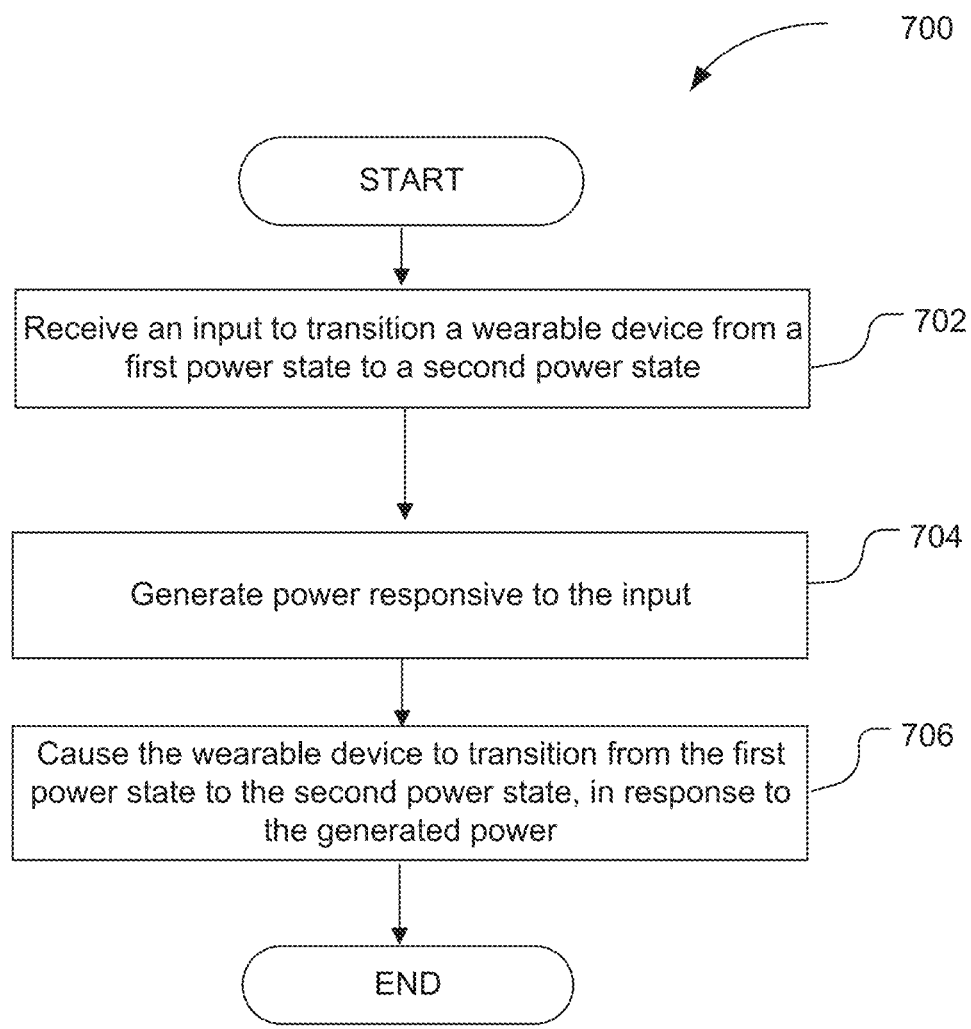
FIG. 7 is a process flow diagram for controlling a transition of a wearable device from a first power state to a second power state, in accordance with some embodiments.

FIG. 7 is a process flow diagram 700 for controlling a transition of a wearable device from a first power state to a second power state, in accordance with some embodiments. The device may include the components of apparatus 100 described in reference to FIGS. 1-5 respectively. The process 700 may be performed by the power state control module 110 of the apparatus 100 (wearable device) described in reference to FIG. 1.

The process 700 may begin at block 702 and include receiving an input to transition the wearable device from a first power state to a second power state that is different that the first power state. As described above, the power state control module may include a power generating device, such as a piezoelectric device, described in reference to FIGS. 3-5. The input may indicate user intent to transition the wearable device from a first power state to a second power state. The input may include receiving, by the piezoelectric device, a tap to cause the piezoelectric device to generate electric charge in response to the input.

In some embodiments, the power generating device may be selected from other devices capable of generating power in response to input of a particular type (hold, stroke, shake, touch and the like).

At block 704, the process 700 may include generating power responsive to the input, independent of a power source associated with the wearable device (e.g., a battery providing operational power to the wearable device in the first and second power states).

At block 706, the process 700 may include causing the wearable device to transition from the first power state to the second power state, in response to the generated power. Causing to transition may include generating, in response to the generated power, a command to a functional module of the wearable device to transition from the first power state to the second power state.

The embodiments described herein may be further illustrated by the following examples. Example 1 is an apparatus with a power state control, comprising: a functional module to operate in a first power state or in a second power state that is different from the first power state; a power source coupled with the functional module to provide operational power to the functional module; and a power state control module coupled with the functional module, to cause the functional module to transition from the first power state to the second power state in response to an input, wherein the power state control module comprises a power generating device to generate power responsive to the input, independent of the power source, and in response to the generated power, cause the functional module to transition from the first power state to the second Example 2 may include the subject matter of Example 1, wherein the apparatus comprises a wearable device.

Example 3 may include the subject matter of Example 2, wherein the power generating device comprises a piezoelectric device to generate electric charge in response to the input.

Example 4 may include the subject matter of Example 3, wherein the wearable device comprises a housing to house at least the functional module and the power state control module.

Example 5 may include the subject matter of Example 4, wherein the housing comprises a semi-rigid material, wherein the piezoelectric device is disposed inside the housing on a rigid former directly underneath the semi-rigid material, wherein the input comprises an external pressure to be applied to a portion of the housing above the piezoelectric device, to be transferred to the piezoelectric device via the semi-rigid material of the housing, to cause generation of the electric charge.

Example 6 may include the subject matter of Example 4, wherein the housing comprises a rigid material, wherein the piezoelectric device is disposed on the rigid material externally to the housing, wherein the input comprises an external pressure to be applied to the piezoelectric device, to cause generation of the electric charge.

Example 7 may include the subject matter of Example 4, wherein the piezoelectric device is a flexible piezoelectric sensor, wherein the housing comprises a semi-rigid material, wherein the piezoelectric device is disposed inside a body of the housing, wherein the input comprises an external pressure to be applied to the semi-rigid material of the body of the housing, to cause flexing of the piezoelectric device that results in generation of the electric charge.

Example 8 may include the subject matter of Example 3, wherein the piezoelectric device is embedded in a mounting feature or a restraining feature of the wearable device, accessible to the input.

Example 9 may include the subject matter of Example 3, wherein piezoelectric device is formed from one of: a monolithic piezoelectric material or macro fiber composite material, wherein the input comprises a tap.

Example 10 may include the subject matter of Example 1, wherein the generated power comprises electric charge, wherein the power generating device is selected from one of: a device comprising a material to generate the electric charge in response to the input, wherein the input comprises a stroke; a device to generate the electric charge in response to heat, wherein the input comprises a hold to provide the heat to the device; a device to generate the electric charge in response to the input, wherein the input comprises a flash with light; a device that includes a ferromagnetic material movable through a coil, to generate the electric charge in response to the input, wherein the input comprises a shake; or a bio-battery to generate the electric charge in response a disposition of an electrolyte across the bio-battery, wherein the input comprises a touch to deliver the electrolyte to the bio-battery.

Example 11 may include the subject matter of Example 1, wherein the power source is to provide the operational power to the functional module in accordance with the first or second power state.

Example 12 may include the subject matter of Example 1, wherein the generated power comprises electric charge, wherein the power state control module further comprises: a rectification circuit coupled with the power generating device, to limit voltage corresponding to the electric charge generated by the power generating device; a charge storage device coupled with the rectification circuit, to store the electric charge at the voltage limited by the rectification circuit; and a power state control interface coupled with the charge storage device, to generate a command to the functional module to transition from the first power state to the second power state, based on the electrical charge stored by the charge storage device.

Example 13 may include the subject matter of Examples 1 to 12, wherein the functional module comprises two or more components, wherein the first power state corresponds to a standby mode, in which a first number of the components of the functional module are powered on, and wherein the second power state corresponds to an operational mode, in which a second number of the components of the functional module are powered on, wherein the second number is greater than the first number.

Example 14 may include the subject matter of Example 13, wherein the functional module comprises a system on chip (SOC).

Example 15 is a wearable device, comprising: a housing; a functional module disposed in the housing, wherein the functional module is to operate in a first power state or in a second power state that is different from the first power state; a power source disposed in the housing and coupled to the functional module to provide operational power to the functional module; and a power state control module substantially disposed in the housing and coupled with the functional module, to cause the functional module to transition from the first power state to the second power state in response to an input, wherein the power state control module comprises a power generating device to generate power responsive to the input, independent of the power source, and in response to the generated power, cause the functional module to transition from the first power state to the second power state.

Example 16 may include the subject matter of Example 15, wherein the power source comprises a battery to provide the operational power to the functional module in accordance with the first or second power states.

Example 17 may include the subject matter of Example 15, wherein the functional module comprises a system on chip (SOC).

Example 18 may include the subject matter of Example 15, wherein the piezoelectric device is disposed directly underneath a surface of the housing or on the surface of the housing and accessible to the input, wherein the input comprises a tap to be applied to an area of the surface directly above the piezoelectric device or to the piezoelectric device respectively.

Example 19 may include the subject matter of Example 15, wherein the housing comprises a surface made of a semi-rigid material, wherein at least a portion of the housing comprises a substantially curved shape, wherein the piezoelectric device comprises a flexible piezoelectric sensor placed inside the curved-shape portion of the housing.

Example 20 may include the subject matter of any of Examples 15 to 19, wherein the piezoelectric device is embedded in a mounting feature or a restraining feature of the wearable device, accessible to the input.

Example 21 is a method for fabricating a wearable device with power state control, comprising: disposing a functional module of a wearable device inside a housing of the wearable device, wherein the functional module is operable in a first power state or in a second power state; disposing a power state control module of the wearable device inside the housing, the disposing including placing a piezoelectric device of the power state control module directly underneath a surface of the housing or on the surface of the housing, to be accessible to an input; and providing a communicative connection between the functional module and the power state control module, to enable transitioning of the functional module from the first power state to the second power state in response to the input to the piezoelectric device causing the piezoelectric device, independent of a power source associated with the wearable device, to generate power causing the functional module to transition from the first power state to the second power state.

Example 22 may include the subject matter of Example 21, wherein the power source comprises a battery, wherein the method further comprises: disposing the battery in the housing; and providing a communicative connection between the battery and the functional module, to provide operational power to the functional module in accordance with the first or second power state.

Example 23 may include the subject matter of any of Examples 21 to 22, further comprising: providing the functional module in a form of a system on chip (SOC).

Example 24 is a method for controlling a transition of a wearable device from a first power state to a second power state, comprising: receiving, by a power state control module of a wearable device, an input indicating user intent to transition the wearable device from a first power state to a second power state that is different that the first power state; generating, by the power state control module, power responsive to the input, independent of a power source associated with the wearable device; and causing, by the power state control module, the wearable device to transition from the first power state to the second power state, in response to the generated power.

Example 25 may include the subject matter of Example 24, wherein the power state control module includes a piezoelectric device, wherein receiving an input includes receiving, by the power state control module, a tap to cause the piezoelectric device to generate electric charge, wherein causing the wearable device to transition from the first power state to the second power state includes generating, by the power state control module, a command to a functional module of the wearable device to transition from the first power state to the second power state.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus, comprising:
a housing;
and
a power state control module disposed in the housing, wherein the power state control module includes:
  a piezoelectric device that is responsive to an input, wherein the input comprises an external pressure to be applied to the piezoelectric device, wherein the piezoelectric device is to generate an electric charge in response to the input;
  a rectification circuit coupled with the piezoelectric device, to limit a voltage level corresponding to the electric charge generated by the piezoelectric device;
  a capacitor coupled with the rectification circuit, to store the electric charge supplied by the piezoelectric device, with the limited voltage level, wherein the rectification circuit includes a first diode provided in parallel to the capacitor, to establish the voltage level on the capacitor, and a second diode provided in series with the first diode, with a breakdown voltage corresponding to the voltage level to be established on the capacitor; and
  a power state control interface circuitry coupled with the capacitor, wherein the power state control interface circuitry, after a voltage level has been established on the capacitor in response to the storage of the electric charge, is to generate a command to cause the apparatus to transition from a first power state to a second power state that is different from the first power state, wherein the power state control interface circuitry includes a comparator powered by the capacitor, and an arrangement of resistances, wherein at least one of the resistances is provided in series with the first diode, to cause the comparator to trigger the command when the voltage level has been established on the capacitor.

2. The apparatus of claim 1, wherein the apparatus comprises a wearable device.

3. The apparatus of claim 2, wherein the wearable device further comprises a functional module coupled with the power state control module, wherein the functional module includes at least a processor and a memory to operate the apparatus in the first and second power states.

4. The apparatus of claim 3, further comprising a power source to provide operational power to the functional module in accordance with the first or second power state.

5. The apparatus of claim 3, wherein the first power state corresponds to a standby mode, in which a first number of components of the functional module are powered on, and wherein the second power state corresponds to an operational mode, in which a second number of the components of the functional module are powered on, wherein the second number is greater than the first number.

6. The apparatus of claim 5, wherein the functional module comprises a system on chip (SOC).

7. The apparatus of claim 1, wherein the housing comprises a semi-rigid material, wherein the piezoelectric device is disposed on a rigid former directly underneath the semi-rigid material, wherein the input comprises an external pressure to be applied to a portion of a mounting feature of the housing above the piezoelectric device, to be transferred to the piezoelectric device via the semi-rigid material.

8. The apparatus of claim 1, wherein the piezoelectric device is disposed externally to the housing, wherein the input comprises an external pressure to be applied to the piezoelectric device.

9. The apparatus of claim 1, wherein the piezoelectric device is a flexible piezoelectric sensor.

10. The apparatus of claim 1, wherein piezoelectric device is formed from one of: a monolithic piezoelectric material or macro fiber composite material, wherein the input comprises a tap.

11. A method, comprising:
    placing a piezoelectric device in a housing of a wearable device, wherein the piezoelectric device is to generate an electric charge in response to an input; coupling a rectification circuit with the piezoelectric device, to limit a voltage level corresponding to the electric charge generated by the piezoelectric device, including providing a first diode and a second diode in series with the first diode;
    coupling a capacitor with the rectification circuit, to store the electric charge supplied by the piezoelectric device, including providing the capacitor in parallel to the first diode, to establish the voltage level on the capacitor, and providing the second diode in series with the first diode, wherein a breakdown voltage of the second diode corresponds to the voltage level to be established on the capacitor; and
    connecting a power state control interface circuitry with the capacitor wherein the power state control interface circuitry, after a voltage level has been established on the capacitor in response to the storage of the electric charge, is to generate a command to initiate a transitioning of the wearable device from a first power state to a second power state, wherein the first power state is different from the second power state, wherein the connecting the power state control interface circuitry includes providing a comparator powered by the capacitor, and further providing an arrangement of resistances, including placing at least one of the resistances in series with the first diode, to cause the comparator to trigger the command when the voltage level has been established on the capacitor.

12. The method of claim 11, wherein the piezoelectric device, the capacitor, and the power state control interface circuitry form, at least in part, a power state control module of the wearable device, wherein the method further comprises:
    disposing a battery and a functional module in the housing;
    providing a communicative connection between the functional module with the power state control module; and
    providing a communicative connection between the battery and the functional module, to provide operational power to the functional module, wherein the functional module is to operate the wearable device in accordance with the first or second power state.

13. The method of claim 11, wherein the functional module comprises a system on chip (SOC).

* * * * *